United States Patent [19]
Lam

[11] Patent Number: 5,137,836
[45] Date of Patent: Aug. 11, 1992

[54] METHOD OF MANUFACTURING A REPAIRABLE MULTI-CHIP MODULE

[75] Inventor: Man K. Lam, Colorado Springs, Colo.

[73] Assignee: Atmel Corporation, San Jose, Calif.

[21] Appl. No.: 704,941

[22] Filed: May 23, 1991

[51] Int. Cl.⁵ .................. H01L 21/52; H01L 21/58; H01L 21/60
[52] U.S. Cl. .................................. 437/8; 437/205; 437/206; 437/915; 437/923
[58] Field of Search ............... 437/8, 923, 205, 206, 437/915; 361/394, 420

[56] References Cited

U.S. PATENT DOCUMENTS

| | | | |
|---|---|---|---|
| 4,012,832 | 3/1977 | Crane | 437/923 |
| 4,355,463 | 8/1982 | Burns | 437/206 |
| 4,806,503 | 2/1989 | Yoshida et al. | 437/206 |
| 4,872,047 | 10/1989 | Fister et al. | 357/67 |
| 4,901,136 | 2/1990 | Neugebauer et al. | 357/75 |

*Primary Examiner*—Olik Chaudhuri
*Assistant Examiner*—David E. Graybill
*Attorney, Agent, or Firm*—Schneck & McHugh

[57] ABSTRACT

A method of manufacturing a repairable multi-chip module including providing a plurality of tape automated bonded chips secured to a corresponding number of substrates by a first bonding material. A second bonding material having a melting point below that of the first bonding material is used to mechanically attach the substrates to a multi-chip package. However, the second bonding material is not melted until after all of the chips have been properly tested. Electrical attachment is provided prior to mechanical attachment by bonding leads of the tape automated bonding frame to the multi-chip module. Removing a defective chip requires only the detachment of the leads. A replacement chip and a replacement substrate are then inserted in the position previously maintained by the defective chip. After the entire module is tested positively, the second bonding material is melted to mechanically attach the substrates to the module. Hermetical sealing of the module is also by means of the second bonding material.

18 Claims, 2 Drawing Sheets

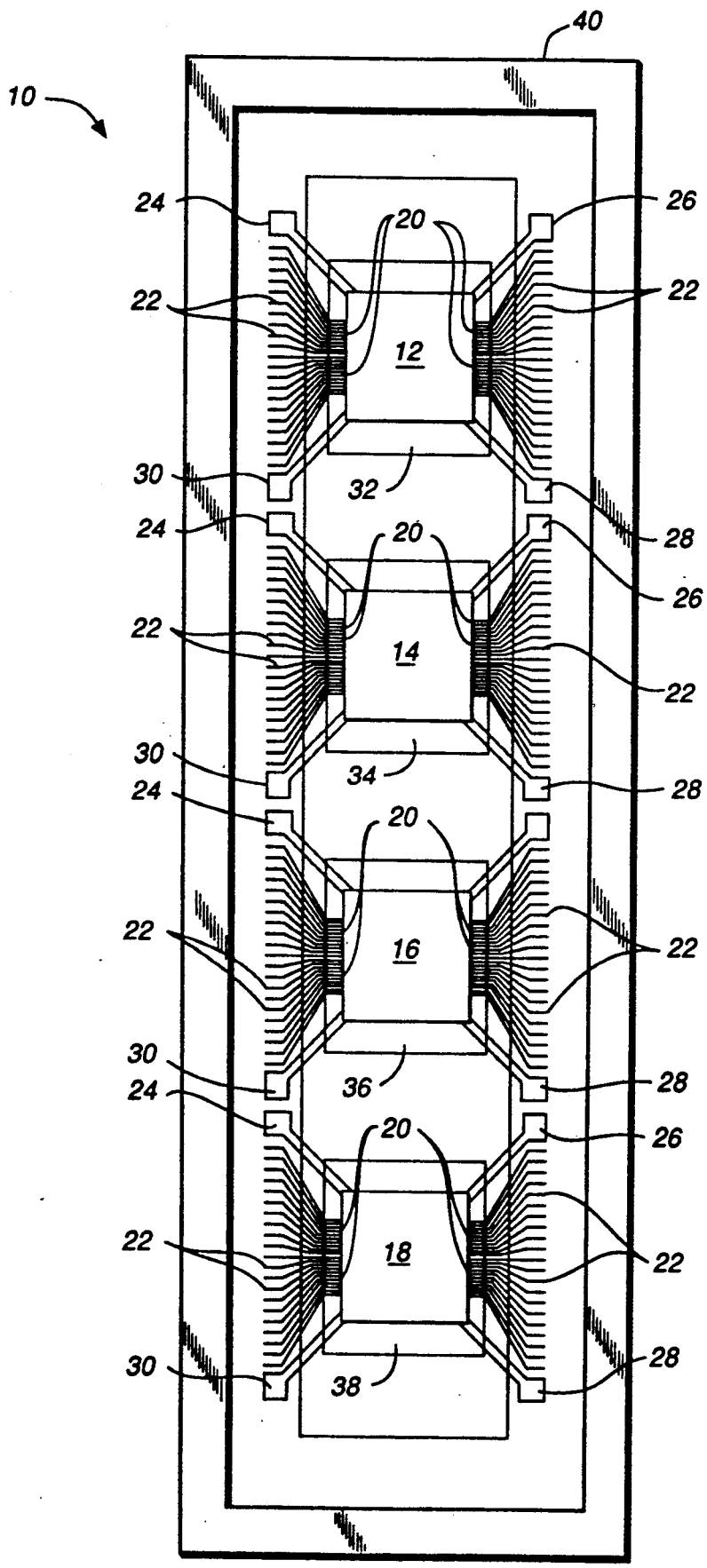
FIG._1

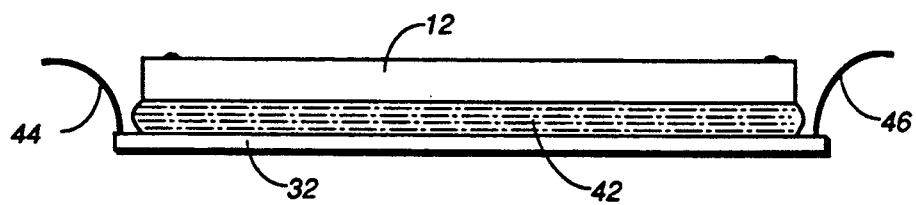
FIG._2
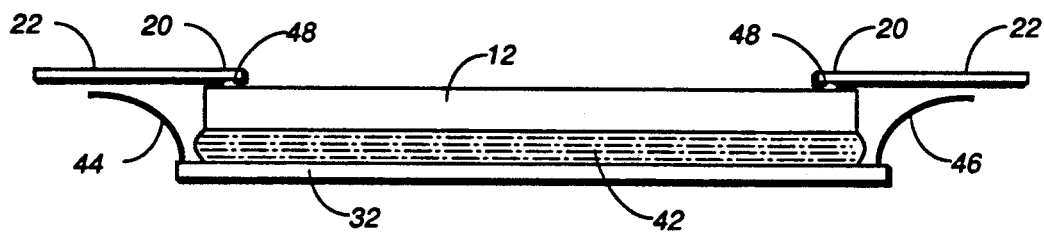
FIG._3
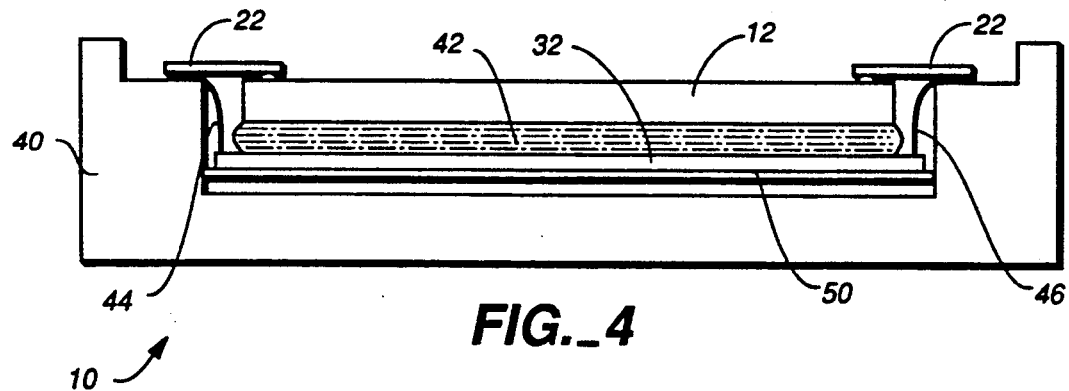
FIG._4
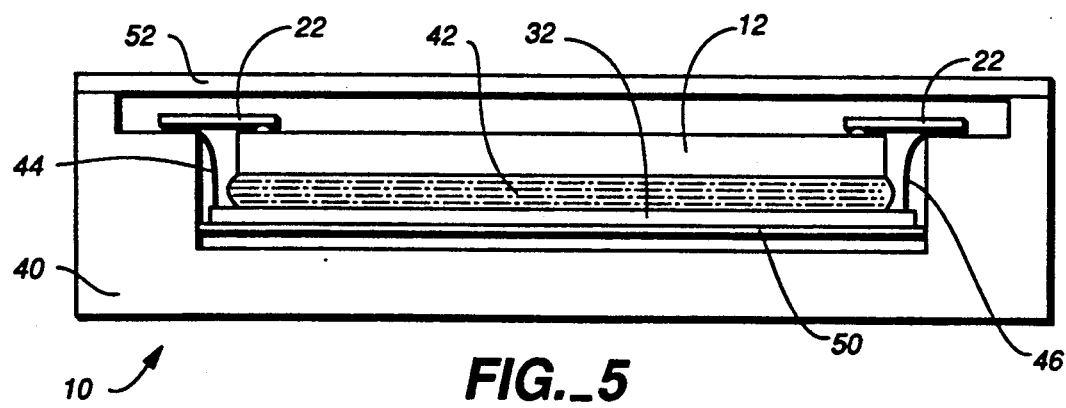
FIG._5

METHOD OF MANUFACTURING A REPAIRABLE MULTI-CHIP MODULE

TECHNICAL FIELD

The present invention relates generally to packaging of integrated circuit chips and particularly to repair of multi-chip modules.

BACKGROUND ART

In electronics, packaging of a number of integrated circuit chips in a single module is increasingly common in order to achieve minimization of the length of interconnection between components. Minimization of the length of interconnections improves the speed and performance of the circuitry. The main disadvantage of multi-chip modules, however, involves the cost of manufacturing such modules. Among the reasons for the high cost of multi-chip modules is the relatively low manufacturing yield of the modules. As the number of integrated circuit chips within a package increases, the likelihood of a defect within the package also increases. Detection of a defective chip within a module may result in the entire module having to be discarded.

Preferably, the individual integrated circuit chips are tested prior to interconnection within the multi-chip module. However, it is not uncommon for an operative chip to be rendered inoperative during the packaging of the chip. For example, a mismatch between the expansion coefficient of two materials used in joining the module to the chip will induce stresses in the bulk of the chip and its surface passivation, as well as the interconnection to the chip. Stress and strain will cause voids and lead to defective chips. Inoperative chips may also be a result of damage to an electrostatic discharge or damage during bonding wire connection.

Replacement of a defective component within a multi-chip module requires removal of both the electrical connection and the mechanical coupling of the component to a package. U.S. Pat. No. 4,901,136 to Neugebauer et al. teaches a multi-chip interconnection package. Electrical disconnection of a single chip may require the desoldering of hundreds of leads. Thus, it is often more cost-efficient to discard the entire package. U.S. Pat. No. 4,806,503 to Yoshida et al. teaches a method of replacing integrated circuit chips interconnected within a multi-chip module by tape automated bonding frames. In tape automated bonding, chips are attached to copper leads supported by a tape similar to 35-mm film. In manufacture of the frame the film is coated with copper, whereafter the leads are formed by lithography and etching techniques. The inner lead ends of the frame are connected to input/output pads of a chip. The outer lead ends are then microbonded to contacts on a substrate, such as a multi-chip module. The replacement method of Yoshida et al. is to cut the conductive traces of the tape automated bonding frame at the centers of the leads. That is, the outer lead bonds are left intact. A replacement part having a frame with leads sufficiently long to overlap the leads left from the first-installed frame is then precisely aligned to allow bonding of the replacement frame to the original leads.

Mechanical decoupling of the defective chip from the package is equally difficult. One method used for the original mechanical attachment of the chips is referred to as eutectic die bonding. This method metal-lurgically attaches the chip to the module. For example, a gold-silicon eutectic composition may be used. A drawback of this method is that the die bond site might not be suitable for replacement die attachment and the heat required to remove an original inoperative die may cause damage to packaged dies and components.

Polymer adhesive and silver glass die bonding are also utilized. The characteristics of materials such as silver glass provide a more void-free bonding method than metal counterparts. U.S. Pat. No. 4,872,047 to Fister et al. teaches a semiconductor die attach system using silver-glass adhesive. One drawback in the use of silver glass, however, is that the material is a thermosetting material which requires a high temperature and a long firing time. Fister et al. teaches use of a solder to dissipate the thermal stresses caused by strains generated during thermal cycling of a die and a substrate, thereby decreasing the susceptibility of the die to damage during attachment. A buffer formed of a thin strip of material capable of withstanding thermal stresses is provided between the chip and the substrate. Firstly, the solder is melted to bond the buffer to the substrate. Fister et al. teaches that the solder is relatively soft and deforms at a relatively low stress to accommodate the stress and strain generated by the mismatch in coefficients of expansion of the buffer and the substrate. Silver-glass adhesive is then deposited on the surface of the buffer and a chip is stacked on the adhesive. The adhesive is then melted and cooled to form the desired bond. Use of the Fister et al. method of attachment increases production yield, but cannot guarantee a yield of 100%. Thus, mechanical decoupling of a defective chip from a package is still a problem.

Mechanical decoupling of a defective chip from a multi-chip module requires melting of the bonding material. Because the silver glass requires a high and an extended melt time, it is difficult to localize heating for removal of the defective chip without affecting bonding of the other chips. Consequently, a previously good chip may be damaged as a neighboring defective chip is removed. Moreover, often there are governmental or industrial standards which are affected by an inability to localize the melting. This is particularly true in multi-chip modules manufactured for military applications. Thus, typically the entire module is discarded.

It is an object of the present invention to provide a method of manufacturing a multi-chip module which allows prepackaging testing of individual chips and wherein the resulting module can be easily reworked.

SUMMARY OF THE INVENTION

The above object has been met by a manufacturing method which allows three levels of testing and which facilitates both electrical and mechanical decoupling of a defective chip from a multi-chip module. Thus, a higher yield results and the overall cost of a multi-chip module is reduced.

A plurality of integrated circuit chips are individually secured to substrates by heating a first bonding material above the melting temperature of the material. The first bonding material has a high melt point. Silver glass is one possible material. Typically, if a chip which is operable after fabrication is later rendered defective, the defect is a result of the thermal cycling during the chip attachment to a substrate. The stresses and strains experienced during thermal cycling cause chip cracking. The present invention allows a first level of testing of individual chips prior to mounting within a multi-chip module.

The method of manufacture further includes electrically attaching a plurality of tape automated bonding frames to a corresponding number of the integrated circuit chips which have been secured to the substrates. Normally, testing of an individual chip prior to interconnection within a multi-chip module is not cost-efficient. However, tape automated bonding provides a spider-like metal pattern of conductive leads which is easily connected to a test apparatus. The tape automated bonding frame allows a second level of testing that is more easily accomplished than the first.

The tape automated bonded chips which have been individually secured to substrates are then electrically and mechanically coupled to a multi-chip module. Preform material having a melting temperature less than the first bonding material is employed for mechanical coupling of the substrates to a module package. The tape automated bonded chips are excised from the bonding frames and positioned atop the preform material. The excised leads are then aligned to a package bond post. However, the preform material is not melted at this time. The electrical coupling includes connecting the leads of the tape automated bonding frame to contacts on the module. Optionally, a relatively rigid ribbon may be attached from the substrate to the module in order to both mechanically attach the substrate and ground the chip via the silver glass and the substrate.

Electrical attachment of a number of the tape automated bonded chips to the multi-chip module allows a third level of testing. At this third level the chips may be required to electrically interact and cooperate with each other in the same manner as will be required in subsequent application. If an individual chip is tested to be below an acceptable standard, removal of the chip is more easily accomplished than in the past. Because the preform material between the chips and the module package has not yet been melted to bond the chips to the package, chip removal consists of merely removing leads that are bonded to the package. Other repairs to the multi-chip module are also possible.

After testing of the module and after all necessary repairs are performed, the module may be hermetically sealed by attachment of a lid. Preferably lid attachment is by means of a preform material identical to that located between the chips and the module. A single melting step is then used to provide lid-to-module hermetical sealing and chip-to-module mechanical attachment.

An advantage of the present invention is that the method allows a number of levels of testing. In comparison to the Fister et al. method of reducing the likelihood that a chip will be damaged during the thermal cycling of silver glass, the present invention addresses the desirability of detecting chips which have been rendered defective by such thermal cycling. A chip may be tested at the wafer level, after attachment to a substrate, after attachment to a tape automated bonding frame, and after final assembly to a module.

BRIEF DESCRIPTION OF THE DRAWINGS

FIG. 1 is a top view of a multi-chip module manufactured in accord with the present invention.

FIG. 2 is a side view of a semiconductor chip of FIG. 1 mounted to a substrate.

FIG. 3 is the assembly of FIG. 2 having a tape automated bonding frame attached thereto.

FIG. 4 is a side view of the assembly of FIG. 3 with leads bonded to a multi-chip package, but with the substrate not secured to the package.

FIG. 5 is a side view of the assembly of FIG. 4 having a lid for hermetically sealing of the package and having the substrate secured to the package.

BEST MODE FOR CARRYING OUT THE INVENTION

With reference to FIG. 1, a multi-chip module 10 is shown as including four semiconductor chips 12, 14, 16 and 18. Each chip is attached to inner leads 20 of a tape automated bonding frame. Tape automated bonding is a fabrication procedure using insulated tape which is similar to photographic film to provide a planar substrate for a spider-like metal pattern of leads. Here, the leads 22 of the tape automated bonding frames "fan two sides of the chips 12-18, but typically the out" from two sides of the chips 12-18, but typically the leads extend from each of the four sides of the chip.

The outer leads 22 of the tape automated bonding frames attach to connection sites of the multi-chip module. The connection sites are interconnected in a manner that allows interaction among the chips. The interconnection within the multi-chip module is not shown. Moreover, the chips 12-18 must communicate with outside circuitry. On a side opposite to that shown in FIG. 1, the multi-chip module may include leads for surface mounting the module to a substrate such as a printed circuit board.

In addition to the inputting and outputting of signals to the chips 12-18 via the leads 22 of the tape automated bonding frame, each chip must be supplied with power and ground potentials. The leads 22 may be employed to supply such utilities, but the frames in FIG. 1 each includes four utility pads 24, 26, 28 and 30. The utility pads provide a ground potential and optionally provide power as well.

FIGS. 2-5 illustrate the method of manufacturing the multi-chip module 10 shown in FIG. 1. The first step is to attach the chips 12-18 to separate substrates 32, 34, 36 and 38. For example, the package 40 may be made of a ceramic material and the substrates 32-38 may be made of an iron-nickel alloy sold under the trademark Kovar. The Kovar substrates are preferably nickel/-gold plated to facilitate soldering. As will be described more fully below, attachment of the chips 12-18 to individual substrates facilitates later removal of an individual chip if the chip is found to be defective.

As shown in FIG. 2, the chip 12 is bonded to the substrate 32 by a bonding material 42. For proper operation of some chips, the chips must be at ground potential. One method of establishing ground at the chip is to utilize ground ribbons 44 and 46. The ground ribbons are semi-rigid to provide mechanical strength during later attachment to the package. The ribbons 44 and 46 ground the substrate 32. Silver glass is typically used for the bonding material 42 to provide a low-resistance electrical connection between the chip 12 and the substrate 32. Gold-silicon eutectic bonding is also possible. Use of silver glass results in fewer damaged chips since the characteristics of the material render the chips less susceptible to cracking under the stresses and strains experienced during chip attachment. This is particularly true for large chips. Chip attachment requires a relatively high temperature. Typically, the silver glass is raised to a temperature of approximately 400° C. Moreover, the material must be fired for an extended period of time. Maintaining the high temperature for a period exceeding ten minutes is common.

The interconnection scheme referred to as tape automated bonding facilitates testing of the chips. As shown in FIG. 3, the inner leads 20 of the tape automated bonding frame are electrically connected to input/output pads 48 on the chip 12. A tape automated bonded component may be exercised electrically and subjected to a burn-in process prior to attachment to a package. The leads 22 of the tape automated bonding frame may be manufactured to extend beyond the attachment length, so that the outer ends may be employed as test connection sites without concern of damaging the connection sites for later attachment to a package. A properly functioning chip may then have its outer leads excised, as shown in FIG. 4. The step of electrically and mechanically coupling the chip 12 to the package 40 is illustrated in FIG. 4. The electrical attachment includes bonding of the leads 22 to connection sites on the package. The connection sites provide electrical communication between the various chips in the package and allow communication between the package and outside circuitry. The electrical and mechanical coupling includes attachments of the ground ribbons 44 and 46 to posts located on the package. Because the ground ribbons are semi-rigid, the ribbons add stability to placement of the device.

A second bonding material 50 is positioned between the substrate 32 and the package 40. It is critical that the second bonding material 50 has a melting point below that of the first bonding material 42. In this manner the second bonding material may be fired without disturbing the connection of the chip 12 to the substrate 32. However, second bonding material is not fired until after testing of the multi-chip package has been performed.

A gold-tin preform is preferred as the second bonding material 50. This is in comparison to the common prior art practice of attaching the chip 12 directly to the package 40 using a eutectic die bonding technique or a silver glass or polymer adhesive die bonding technique. The second bonding material should be the material that is used to hermetically seal a lid to the package.

After electrical attachment of each tape automated bonded chip 12 to the package 40, the assembled package is tested. Any chip which is determined to be unacceptable is replaced merely by removing the leads 22 from the package and bonding a new chip in place. Because the second bonding material 50 has not bee fired, localized heating at the interface of the substrate 32 and the package 40 is not required. The cycle of testing and chip failure replacement is repeated until the final assembly is tested as being above standard requirements.

Referring now to FIG. 5, a lid 52 may then be secured to the package 40 to hermetically seal the chips 12 within the multi-chip module 10. Again, a gold-tin preform is used to provide the attachment. The lid attachment preform and the second bonding material 50 are fired simultaneously to secure the lid 52 and the substrates 32 to the package 40.

The multi-chip module 10 shown in FIG. 1 includes four chips 12-18. The number of chips within a module, however, is not critical. The chips may be one megabyte memory devices. Thus, to increase the module's capability to eight megabytes, the module need only be expanded to receive four additional devices.

Because not all chips need to be grounded to a multi-chip module, utilizing silver glass and ground ribbons is not critical to the present invention. For chips which do not require such grounding, the silver glass may be replaced by glass bonding and the ground ribbons may be eliminated.

I claim:

1. A method of manufacturing a repairable electronic multi-chip module comprising, mechanically securing a plurality of integrated circuit chips to a plurality of substrates by heat treatment of a first bonding material having a first melting temperature, and after securing said chips to said substrates, electrically and mechanically coupling said plurality of chips to a chip package, said mechanical coupling including attaching said substrates to said chip package by application of a second bonding material, said application of said second bonding material being at a maximum temperature below said first melting temperature, thereby allowing attachment of said substrates to said chip package without melting of said first bonding material.

2. The method of claim 1 wherein said application of said second bonding material is a step of initiating melting of said second bonding material having a second melting temperature less than said first melting temperature.

3. The method of claim 1 further comprising the step of electrically testing said chips fixed to said substrates after said electrical coupling of said chips to said chip package but prior to said attaching of said substrates to said chip package.

4. The method of claim 1 wherein said step of securing said chips to said substrates includes application of an electrically conductive first bonding material therebetween.

5. The method of claim 1 wherein said step of securing said chips to said substrates includes providing said substrates made of an iron-nickel alloy.

6. The method of claim 5 wherein said iron-nickel alloy is nickel-gold plated.

7. The method of claim 1 wherein said step of attaching said substrates to said chip package includes application of a solder preform.

8. The method of claim 1 further comprising electrically linking said chips to said chip package by attachment of a tape automated bonding frame.

9. A method of manufacturing a repairable multi-chip module comprising, securing a plurality of integrated circuit chips to a plurality of substrates by heating a first bonding material above the melting temperature of said first bonding material, each chip being electrically connected to a tape automated bonding frame, providing a second bonding material between said substrates and a multi-chip module for mechanically attaching said substrates to said module, said providing said second bonding material being a providing of a material having a melting temperature below the melting temperature of said first bonding material, electrically coupling said plurality of chips to said module, said electrical coupling including connecting leads of said tape automated bonding frame to contacts on said module, and mechanically coupling said substrates to said module, said mechanical coupling including heating said second bonding material above the melting temperature of said second bonding material but below the melting temperature of said first bonding material.

10. The method of claim 9 further comprising hermetically sealing said module using a sealing material having a melting temperature below that of said first bonding material.

11. The method of claim 9 further comprising the step of electrically testing said chip after said electrical coupling to said module and before said mechanical coupling.

12. The method of claim 9 wherein said chips are secured to said substrates by silver glass.

13. The method of claim 9 wherein said step of providing said chips is a step of providing memory chips.

14. The method of claim 11 wherein said substrates are made of an iron-nickel alloy.

15. A method of repairing a multi-chip module comprising, fixing a plurality of integrated circuit chips to a plurality of substrates by heat treating a first bonding material having a first melting temperature, electrically attaching said plurality of substrates to a multi-chip module, removing a defective chip of said plurality of chips from said module by electrically detaching said defective chip, inserting a replacement chip attached to a replacement substrate in a position previously maintained by said defective chip, electrically attaching said replacement chip to said module, and heating a second bonding material to a temperature less than said first melting temperature to secure said replacement substrate and said plurality of substrates to said module.

16. The method of claim 15 further comprising testing said plurality of chips prior to said heating of said second bonding material.

17. The method of claim 16 wherein said electrical attaching includes an attachment of a tape automated bonding frame between each chip and said module.

18. The method of claim 15 further comprising the step of hermetically sealing said module using a material having a melting temperature less than the melting temperature of said first bonding material.

* * * * *